United States Patent [19]

Coleman

[11] 3,863,334

[45] Feb. 4, 1975

[54] ALUMINUM-ZINC METALLIZATION

[75] Inventor: Michael G. Coleman, Tempe, Ariz.

[73] Assignee: Motorola, Inc., Franklin Park, Ill.

[22] Filed: May 7, 1973

[21] Appl. No.: 358,180

Related U.S. Application Data

[63] Continuation of Ser. No. 121,708, March 8, 1971, abandoned.

[52] U.S. Cl. .................... 29/590, 148/188, 357/67, 357/63

[51] Int. Cl. .................... B01j 17/00

[58] Field of Search .................... 29/590; 148/1.5, 188

[56] References Cited

UNITED STATES PATENTS

| | | | |
|---|---|---|---|
| 3,354,365 | 11/1967 | Belasco | 29/590 |
| 3,456,209 | 7/1969 | Diemer | 148/1.5 |
| 3,601,888 | 8/1971 | Engeler | 29/590 |

*Primary Examiner*—Granville Y. Custer, Jr.
*Assistant Examiner*—W. C. Tupman
*Attorney, Agent, or Firm*—Charles R. Hoffman; Vincent J. Rauner

[57] ABSTRACT

There is disclosed an aluminum-zinc alloy ohmic contact for semiconductor materials and methods for providing these ohmic contacts. This aluminum-zinc alloy contact has special application in P-type III-V compound semiconductor materials, and particular advantage in lightly doped P-type III-V compound semiconductors, to decrease the contact resistance, increase uniformity of the contact, improve wire bonding ease and quality, decrease electromigration, and decrease the substrate temperature for contact formation. In addition this alunimum-zinc alloy provides that formation of brittle gold-aluminum intermetallic compounds on the surface of the contact is retarded or eliminated when gold wire is used for wire bonding. The aluminum-zinc contact is also used to advantage on elemental semiconductor materials and with II-VI compound semiconductor materials for the purpose of decreasing electromigration. Most importantly, in the P-type III-V compound semiconductors, a contact made from the aluminum-zinc alloy self-dopes the region directly under the contact, forming a highly doped region below the contact. The highly doped region is formed by zinc atoms from the alloy. Formation of the highly doped region in this manner is thus accomplished without the necessity of separate dopings and/or photolithographic steps.

7 Claims, 26 Drawing Figures

INVENTOR
Michael G. Coleman
BY
Mueller & Aichele
ATTY'S

INVENTOR.
Michael G. Coleman
BY
Mueller & Aichele
ATTY'S

INVENTOR.
Michael G. Coleman
BY
Mueller & Aichele
ATTY'S

ALUMINUM-ZINC METALLIZATION

This is a continuation of application Ser. No. 121,708, filed Mar. 8, 1971, and now abandoned.

BACKGROUND

This invention relates to an ohmic contact for semiconductor materials, and to methods for making this contact. More specifically, the ohmic contact is made from an alloy of elemental aluminum and elemental zinc which is deposited on the semiconductor material by co-evaporation of the two metals from their alloy form. The resulting contact has associated with it a highly doped region immediately under the contact in which the V doping is provided by the zinc atoms in the alloy, thus alleviating the necessity of providing a separate highly doped region under the contact.

While the subject contact has its greatest utility in III-V compound semiconductors, it may be used to advantage as a contact to any semiconductor material for the purpose of reducing electromigration in the metallization of the semiconductor. Thus, the subject contact has utility when used in conjunction with elemental semiconductor materials such as silicon and germanium, as well as with compound semiconductors whose elements are taken from Group II and Group VI of the periodic table. It will further be appreciated that the aluminum-zinc contact, to be described herein, is also utilized in contacting semiconductors wherein the semiconductor is either a binary compound, a ternary compound or even a more complex compound of chemical elements forming a semiconductor material.

Although the ohmic contact to be described has utility in virtually every semiconductor material, it will be described in connection with P-type III-V compound semiconductors, because of its unique advantage over elemental aluminum metallization systems typically used in the metallization of these III-V compound semiconductors.

The use of elemental aluminum with III-V compound semiconductors has associated with it a wide variety of problems. Perhaps the most important problem is the high contact resistance between pure aluminum metallization layers and the P-type substrate, over which it is deposited. The high contact resistance is in part due to the lack of doping of the III-V semiconductor material by the aluminum, since aluminum is itself a III type element. Because of this lack of doping, a highly doped region under the aluminum contact must usually be provided and this requires extra processing steps which are both time consuming and costly.

Additionally, in order to minimize the contact resistance between the aluminum and the semiconductor, it is normally necessary to use a high temperature heat treatment cycle subsequent to the deposition of the aluminum onto the semiconductor. This high heat treatment step is sometimes referred to as "burning in" and is generally undesirable since it may, in fact, destroy or deleteriously alter the active elements in the semiconductor.

Because elemental aluminum is not a heavy metal, electromigration, to be described in detail hereinafter, is prevalent at current densities greater than $10^5$ amps/cm$^2$, causing separation in the pure aluminum metallization strips which results in open circuits and device failure.

Further, when pure aluminum contacts are used, a hard coherent layer of aluminum oxide forms on the surface of the aluminum. This layer of aluminum oxide is an insulator and must be pierced before satisfactory wire bonding can be accomplished. In addition, with the use of pure aluminum contacts, an intermetallic compound which is excessively brittle may be formed between the wire and the aluminum contact if other than aluminum wire is used. This brittle intermetallic compound causes the contact wires to break off from the contact.

There is, in addition, a peculiar problem when contacts are made to light emitting diodes. In a light emitting diode, it is important that the contact occupy as small an area as possible in order that the minimum area of the light emitting diode be covered by opaque metallization. If the specific contact resistance is large as with aluminum, a larger area must be contacted in order to achieve the necessary characteristics of the light emitting diode than if a material with a lower contact resistance is used. The larger the specific contact resistance, the larger the area of the contact that is required to achieve a given total resistance. This larger contact area masks areas of the light emitting diode from which light is emitted, reducing the efficiency of the device. A still further problem occurs with light emitting diodes. Light generated at or near the PN junction of the diode travels from the junction through the diode material before it emerges from the semiconductor body. However, some of the generated light is absorbed in the semiconductor body before it emerges. The higher the concentration of dopants in the semiconductor, the larger the amount of light absorption that occurs. Conversely, the higher the dopant concentration, the more readily a low resistance ohmic contact is made to the diode elements. When pure aluminum contacts are used, either the contact must cover a large area or excessive doping must be used in order to provide adequate contact. Both of these expedients are undesirable because they reduce the amount of light delivered by the light emitting diode.

In prior art pure aluminum metallization systems, the doped region below the contact not only is opaque to the light emitted by the diode but also extends into the surface of the diode to such an extent that a not small portion of the light emitted by the diode is absorbed by the highly doped region at the surface of the diode. What is required for a light emitting diode, and indeed for many other types of semiconductor devices, is a very high concentration of the dopant which high concentration is restricted to a very shallow area underneath the contact. The concentration is made high enough to permit good ohmic contact with the metallization, while at the same time, being thin enough to be substantially transparent to the light from the light emitting diodes.

In the prior art, aluminum has been used with a variety of other metals to improve its ohmic contact characteristics. However, in the prior art, there has been considerable problem in controlling the deposition rates of the multiple metals. In these prior art systems, it is necessary to deposit successive layers of metallization and subsequently heat these layers so as to form the appropriate alloy. This causes the substrate to be heated for that time and that temperature which is sufficient to produce the desired metallization alloy. However, the formation of the alloy in this manner can deleteriously affect the active semiconductor elements in the chip. Alternatively, two metals have been simultaneously evaporated from different sources at the same time. This leads to problems of control of the correct proportions of the two metals on the semiconductor body and variability in the properties of the co-mingled metallization layer thus produced.

The solution to the aforementioned problems centers around the finding of a particular alloy which will form a true low resistance ohmic contact with the semiconductor materials. It will be appreciated that a true ohmic contact is one that follows Ohm's law directly such that there is no rectification at the boundary between the metallization layer and the semiconductor material. This means that there is no rectification such that the metals do not form a Schottky barrier with the semiconductor materials. It will be appreciated that there are two ways of solving the barrier problem for making what is called a good ohmic contact. The first way is picking a metal which has a minimum barrier height, while the second is picking a metal with a minimum barrier width so that electrons may tunnel directly from the conductor into the semiconductor. The problem of barrier height is primarily solved by the choice of metal, while the barrier width is narrowed by modifying the semiconductor by doping the contacting area so heavily that it acts by itself nearly like a metal. This area is called a degenerate semiconductor. The aluminum-zinc alloy is chosen because aluminum itself has a reasonably small barrier height with, for instance, gallium arsenide. Aluminum has, however, a very wide barrier which contributes to the inability to provide good ohmic contact. Since zinc is a P-type dopant for III-V compound semiconductors, by combining zinc and aluminum, a source of P-type dopant impurities is supplied at the surface of the semiconductor by the alloy. After having chosen the aluminum-zinc alloy, it was found that a method involving co-evaporation of elemental aluminum and elemental zinc produced an improved metallization layer. It was also found that due to the co-evaporation an extremely highly doped surface region is formed immediately adjacent the already opaque contact area. This is important in light emitting diodes because this allows the remainder of the surface of the light emitting diode to be lightly doped to enhance light output. Thus the metallization system described herein, is particularly well adapted to light emitting diodes and to those semiconductors which require a very shallow and heavily doped region limited to the vicinity of a contact.

The advantages arising from the use of an aluminum-zinc alloy contact and from the metallization method described herein, are first that a "self-doping" contact is formed. Secondly, a nearly homogeneous metallization layer is deposited which can be uniformly etched. It is sufficient that the contact be applied at substrate temperature clearly 100°C less than those necessary for pure aluminum without the need for temperature recycling. It was found that aluminum wires bond to the aluminum-zinc alloy contact extremely readily. When gold wires are used, the aluminum-zinc-gold intermetallic compound at the surface of the contact is much less brittle than the aluminum-gold intermetallic formed heretofore. The actual formation of an intermetallic compound with aluminum, zinc and gold is retarded with respect to the intermetallic compound formed with aluminum and gold. In addition, the aluminum-zinc contact has a thinner and considerably less coherent oxide layer thereon as compared to the aluminum oxide layer on the elemental aluminum contact. Thus, wire bonds can be made to the aluminum-zinc contact with much less pressure than was previously necessary for contacting pure aluminum. As mentioned hereinbefore, homgeneity of the alloy is due to the co-evaporation process in which the metals are essentially evaporated at uniform evaporation rates from the alloy. The uniformity of the rates prevents the formation of a layered structure, therefore enabling uniform etching. Uniform etching results in sharp geometric definition for contact patterns.

Further regarding the method utilized in the subject invention for depositing the metallic contact, lower substrate temperatures are utilized resulting in finer grain structures of the contact material. Not only do the low substrate temperatures prevent damage to the active portions of the semiconductor, but also the finer grain structure contributes significantly to the aforementioned sharp geometric definition.

Finer grain size also results in reduced electromigration. Electromigration is reduced because of the shorter mean free paths for the electrons traveling within the fine grained metallized strip or layer. Furthermore, by the addition of the zinc to the aluminum, the zinc imparts its higher atomic weight to the alloy giving it a density which precludes a large portion of the electromigration.

With respect to the co-evaporation, the subject method involves a slow formation of the alloy to prevent premature zinc vaporization within the evaporation chamber and a subsequent rapid evaporation of the alloy to provide for substantially constant evaporation rates and the aforementioned uniformity. The use of measured amounts of an alloy previously formed by conventional techniques, can be substituted for the alloy formed wholly within the filament. It is important to note that the aluminum-zinc deposition takes place from within a single filament heater element. Thus depositions from separate heating elements are specifically avoided by this invention.

SUMMARY OF THE INVENTION

It is therefore an object of this invention to provide an aluminum-zinc alloy as a contact for semiconductor material.

It is a further object of this invention to provide a method for forming an aluminum-zinc alloy metallization layer on a semiconductor material.

It is another object of this invention to provide a metallization layer over a lightly doped semiconductor material by a process involving the evaporation of elemental aluminum and elemental zinc from an alloy of these elements.

It is a still further object of this invention to provide a method for forming a metallization layer on P-type semiconductive material such that the semiconductive material is doped with a P-type dopant by an aluminum-zinc alloy deposited thereon by a process involving co-evaporation of the elemental metals which are the constituents of the alloy.

It is a still further object of this invention to provide a special type contact for light emitting diodes in which the contact is formed from an alloy of aluminum and zinc deposited on the surface of the light emitting diode such that a shallow, heavily doped region is formed at the surface of the light emitting diode directly underneath the contact.

Other objects of this invention will be better understood upon reading the following description in connection with the accompanying drawings.

BRIEF DESCRIPTION OF THE INVENTION

There is disclosed on aluminum-zinc alloy ohmic contact for semiconductor materials and methods for providing these ohmic contacts. This aluminum-zinc alloy contact has special application in P-type III-V compound semiconductor materials, and particular advantage in lightly doped P-type III-V compound semiconductors, for decreasing the contact resistance, increasing uniformity of the contact, improving wire bonding ease and quality, decreasing electromigration, and decreasing the substrate heats for contact formation. In addition, this aluminum-zinc alloy provides that formation of brittle gold-aluminum intermetallic compounds, should gold wire be used for wire bonding, be retarded or eliminated. The aluminum-zinc contact may be used to advantage on elemental semiconductor materials and with II-VI compound semiconductor materials for the purpose of decreasing electromigration. Most importantly, in the P-type III-V compound semiconductors the aluminum-zinc alloy self-dopes the region directly under the contact to form a highly doped region adjacent the contact, since zinc atoms from the alloy are driven into the semiconductor substrate. Formation of the highly doped region in this manner is thus accomplished without the necessity of separate doping and/or photolithographic steps.

DETAILED DESCRIPTION OF THE INVENTION

Figure 1:
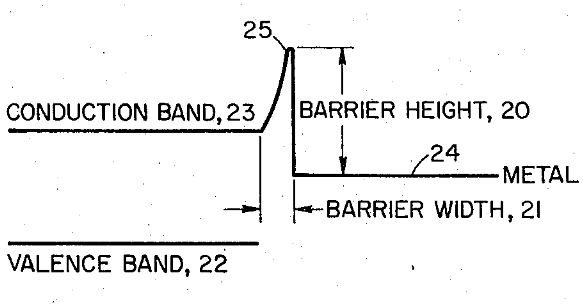
FIG. 1 is a diagram showing the barrier width and the barrier heighth of a metallization layer with respect to the valence and conduction bands of a P-type semiconductor material.

As mentioned hereinbefore and referring to FIG. 1, the choice of a contact metal for a semiconductor is based on the barrier height and barrier width at the junction between the contact metal and the semiconductor surface. Since it is desirable to create an ohmic contact, that is one which follows Ohm's law directly, there must be no rectification involved at the interface between the contact and the surface of the semiconductor material. This can be explained in terms of the Schottky barrier having a barrier height denoted by arrows 20 and a barrier width denoted by arrows 21 on the energy level diagram shown in FIG. 1. Assuming a given band gap between the conduction band 22 and the valence band 23, the particular metal involved will have a certain energy level denoted by the line 24. This level is the Fermi level of the metal and as such is filled with electrons. In order to achieve ohmic contact, the electrons must flow freely to or from the Fermi level to the conduction band so that conduction can occur. There is a tendency, however, for the electrons in the metal to be opposed by the electrons in the conduction band such that this energy must be overcome. This is shown by a potential hill 25. By way of analogy, according to the energy level diagram the electrons must climb the hill 25 in order to reach the conduction band 23. This is analogous to overcoming the electro-static forces which tend to repel the electrons. There is an alternate path for the electrons to take in order to reach the conduction band 23 and this phenomena is called "tunneling." Tunneling involves piercing the potential hill at the energy level of the conduction band. Tunneling more readily occurs when the barrier width 21 is narrow so that the electrons can tunnel directly into the semi-conductor material. A more perfect ohmic contact is provided first by reducing the barrier height and is accomplished primarily by an appropriate choice of the metal. The choice of the metal is however not too critical if the barrier width can be narrowed. In fact the barrier heights of metals do not vary more than 50 percent in covalent semiconductors. The barrier width 21 is narrowed by modifying the surface of this semiconductor by doping the contact area of the semiconductor so heavy that the semiconductor acts like a metal. When this occurs, contact resistance can be lowered greatly. The amount of doping necessary to narrow the barrier width varies dramatically from semiconductor to semiconductor and also from N-type to P-type materials. In general, however, dopings of $10^{19}$ atoms per cubic centimeter generally result in degenerate semiconductors, although ideally, dopings as high as $10^{20}$ atoms per cubic centimeter significantly limit the barrier width.

Elemental aluminum has a reasonably small barrier height and in III-V compound semiconductors, zinc is a P-type dopant. When both zinc and aluminum are formed into an alloy and when the alloy is placed in intimate contact with the III-V compound semiconductor, the alloy has substantially the same barrier height as elemental aluminum. Additionally, zinc penetrates into the surface of the III-V compound semiconductor and increases the doping concentration near the point of contact, thereby reducing the barrier width between the metal and semiconductor.

There are several methods of contact formation which enable the use of the aluminum-zinc alloy as a contact material. The first method is the general case and is used when contact is to be made to semiconductor material which ranges from lightly to highly doped. The next three methods have special utility in light emitting diode applications. The latter two of these three methods include steps of forming a light to moderately doped material in a substrate and subsequently provided a contact at the doped area. These latter two methods are particularly useful in applications where only thin regions of light doping is required. In these applications, a PN junction is formed by a low concentration dopant maintained at or close to the semiconductor surface by diffusing the dopant through a thin oxide or dielectric layer. In the case of light emitting diodes, the PN junction is formed by diffusing the dopant through this thin layer. This provides that the amount of dopant be limited and kept close to the surface so as to prevent absorption of the emitted light by the doping materials. In addition, diffusing the dopant material through a thin dielectric layer prevents, to a certain extent, extraneous matter from doping the surface of the semiconductor. In this manner, the dielectric operates as a moderator or a selective filter.

It will be appreciated that all of the methods involve the aforementioned self-doping aspects of the invention.

For purposes of explanation, the methods will be described in terms of III-V compound semiconductor materials although other semiconductor materials can be successfully contacted by aluminum-zinc contacts.

METHOD I

Figures 2A, 2B, 2C, 2D:
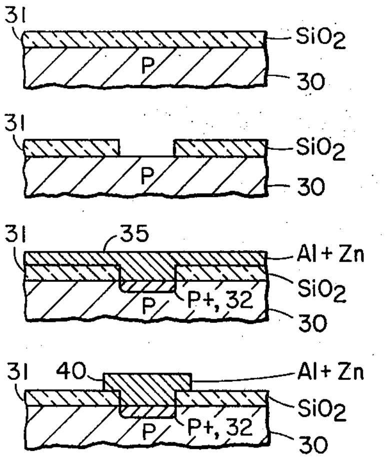
FIGS. 2*a* – 2*d* show intermediate and final structures which result from one method of forming an aluminum-zinc alloy contact on a semiconductor substrate surface.

Referring to FIG. 2*a*, a P-type substrate 30 is provided with a dielectric layer 31 of silicon dioxide. In addition to silicon dioxide, dielectric layers of silicon nitride may be successfully used. The dielectric layer 31 is then patterned and etched down to the surface of the substrate 30, as shown in FIG. 2b, so as to leave an opening for the deposition of the contact. It will be appreciated, that normal masking techniques and etching techniques which are well known may be used at this point to etch the dielectric. Thereafter, the aforementioned aluminum-zinc alloy is deposited over the entire structure, as shown by the layer 35 in FIG. 2*c*. The aluminum-zinc alloy in the preferred embodiment is 50 percent elemental aluminum and 50 percent elemental zinc by weight, although any composition of the alloy in the range from 1 to 60 percent by weight of zinc provides the aforementioned advantages to the subject contact. The method of depositing the aluminum-zinc alloy will be discussed in connection with FIG. 9. At this point it is sufficient to note that the substrate 30 can be heated to 200°C or above in order to drive in the zinc so as to form a P+ region 32 directly under the contact. Alternately, the entire structure can be heated after the aluminum-zinc has been deposited. It will be appreciated that some doping will occur even at room temperature. in any event, after the aluminum-zinc alloy has been deposited, it is patterned and etched so as to form contact 40 as shown in FIG. 2*d* by conventional photolithographic techniques. Etchants which are commonly used for pure aluminum may be used as etchants for the subject aluminum-zinc alloy. Descriptions of masking and etching are not included in this description because they are well known in the art. Moreover, it will be appreciated that the thickness of the aluminum-zinc contact can vary and that the thickness of the contact is not critical. As will be mentioned in connection with FIG. 9, during the deposition of the substrate is at a relatively low temperature of between room temperature and 400°C; 200°C being the preferred temperature. This results in fine grained structures which, in part, permit the aforementioned sharp etching. In addition, as described in connection with FIG. 9, a uniformly dispersed two phase alloy is deposited because of the controlled evaporation rates of the elemental aluminum and the elemental zinc. This also accounts for the aforementioned sharp edges of the aluminum-zinc contact. In connection with the methods shown in FIGS. 2*a* – 2*d*, it will be appreciated that the subject contact may be made to silicon and germanium. As mentioned previously, the main advantage of the subject contact on these elemental semiconductors is the reduction in electromigration since aluminum already adequately dopes these materials. In addition to elemental semiconductors, II-VI type compound semiconductors also derive a benefit from an aluminum-zinc contact fabricated by the above method. This benefit is also in terms of a reduction of electromigration. In addition to the reduction of electromigration, the above mentioned semiconductors having aluminum-zinc contact, benefit in the ease with which wire bonds can be attached. It is thought that this improvement is the result of the formation of a thinner or non-coherent surface layer oxide. Further it appears that any intermetallic compound formed is less brittle when gold wires are used in the wire bonding process. Details of these advantages will be enumerated in connection with FIG. 8 hereinafter. It is also noteworthy that if a contact is desired over the entire surface of a semiconductor, the patterned dielectric layer 31 is omitted. It will be appreciated that the above contact may be made to semiconductor material which is incorporated into resistors, diodes, transistors, varactors or other semiconductor structures.

There is a group of compound semiconductors which, in addition to acquiring the aforementioned benefits, also achieve better ohmic contact. These are the aforementioned III-V compound semiconductors. The type III materials used in these compound semiconductors are in general aluminum, gallium and indium. The group V elements, commonly used, are phosphorous, arsenic and antimony. As examples of binary compound semiconductors, the subject contact and methods for applying it work exceptionally well on gallium arsenide, gallium phosphide, indium arsenide and indium antimonide and other binary III-V compound semiconductors. As examples of ternary compound semiconductors, the subject contacts are used to advantage in gallium arsenide phosphide compound semiconductors, as well as gallium aluminum arsenide compound semiconductors. While the state of the art in quaternary compound semiconductors presents some problems in the control of the constituent elements, the subject contact provides improved results in a quaternary compound such as gallium aluminum arsenide phosphide.

The above mentioned elements and compounds may be used in any of the methods described in FIGS. 3, 4 and 5 as substrate materials.

METHOD II

Figures 3A, 3B, 3C, 3D, 3E:
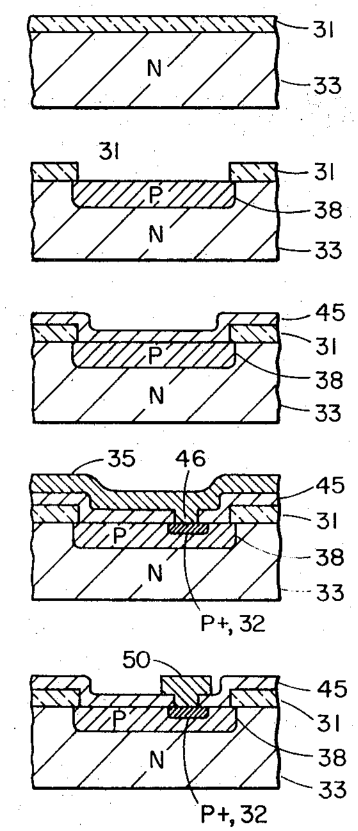
FIGS. 3*a* – 3*e* show intermediate and final structures resulting from a second method for forming an aluminum-zinc contact on a semiconductor substrate surface.

Referring now to FIG. 3*a*, an alternate contact formation method for use in light emitting diodes is shown in which an N-type substrate 33 is provided with a relatively thick dielectric layer 31 which is thick enought to prevent the diffusion of zinc or another P-type dopant therethrough. As can be seen in FIG. 3*b*, the dielectric layer 31 is patterned and etched in much the same way that the dielectric 31 of FIG. 2*b* is patterned and etched. Zinc, or another P-type dopant, is then diffused into the N-type substrate 33 through the exposed portion of the surface of the substrate 33 defined by the opening in the dielectric layer 31 to form the P-type region 38. This P-type region now forms a diode with the N-type substrate 33. The major difference in this method from the previous method does not come in this formation of the P-type region, but in the step shown in FIG. 3*c*. Here, an optical thickness dielectric layer 45 is then deposited over the dielectric layer 31 into the aperture and onto the surface of the region 38. The purpose of the thin dielectric layer 45 is to reduce reflection of the light generated at the diode PN junction back toward the junction from the top surface of the P-type region 38. Reflection of the major portion of the light incident on this surface would normally occur at this surface because of the high index of refraction of the material of the diode. The dielectric layer 45 acts as an anti-reflective coating. If it is desired that light come out of the top surface of the diode, the thickness of the anti-reflective coating is typically an odd number of ¼ wavelengths of the light generated at the PN junction of the diode and propagating through region 38. If it is desired that the light come out of the bottom of the diode, this thickness is an even number of ¼ wavelengths to maximize reflection towards the desired direction of emission. The dielectric layer 45 may be silicon dioxide, silicon nitride or other dielectric material which is substantially transparent to the light emitted from the diode. As shown in FIG. 3d, a preohmic hole or aperture 46 is formed in the dielectric layer 45 for the purpose of permitting metallization of the now exposed surface of the P-type region 38. Metallization is accomplished by providing an aluminum-zinc alloy layer 35 which is basically the same as the layer 35 shown in FIG. 2c. This layer 35 extends down into the preohmic hole 46 through the layer 45 and contacts the P-type region 38 forming a P+ region 32. This P+ type region is more readily formed if the substrate is heated to near 200°C or above during or after the deposition of the layer 35. Thereafter, as shown in FIG. 3*e*, the aluminum-zinc contact is masked, patterned and etched in the same manner as that referred to in connection with FIG. 2*d* so as to form an aluminum-zinc alloy type contact 50. The areas of the region 38 and the layer 45 which are covered by the metal 50 are small compared to the total surface area of the region 38 such that only a small amount of light from the diode is blocked by the opaque metallization 50 or is absorbed by the P+ region 32.

In addition to the advantages occurring in the aforementioned method, there are the additional advantages of the shallow zinc doping by the contact which is especially important in light emitting diodes. A further advantage in using an aluminum-zinc alloy contact is the substantially constant evaporation rates of the aluminum and zinc. This control of evaporation rates results in the capability of patterning finer contact geometries which are desirable in light emitting diodes so as to minimize the amount of light blocked by the contact. These finer geometries are possible due to the substantially constant composition of the aluminum-zinc alloy throughout its thickness. This allows a nearly constant etch rate through the thickness of the aluminum-zinc alloy in the areas being etched away, in addition to the contribution of the inherent fine grain structure of the deposited alloy.

METHOD III

Figures 4A, 4B, 4C, 4D:
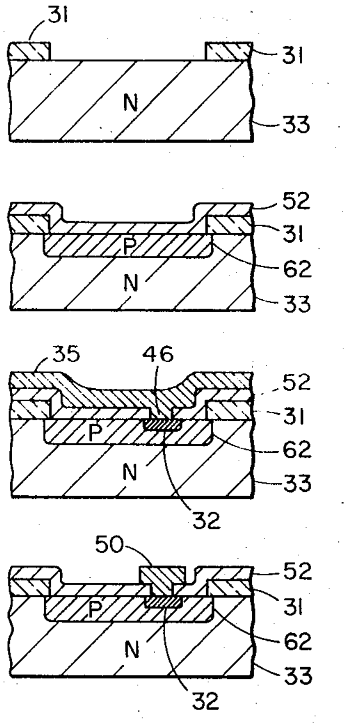
FIGS. 4*a* – 4*d* show intermediate and final structures resulting from a third method for forming aluminum-zinc contacts on semiconductor substrate surfaces in which doping to form a PN junction is accomplished by diffusing through an oxide layer.

FIGS. 4*a* – 4*d* illustrate one method of providing a contact to a P-type material formed by diffusing the P-type dopant through a layer of dielectric. As shown in FIG. 4*a*, and N-type substrate 33 is provided with a layer of dielectric 31 which is patterned by conventional photolithographic methods, as previously described in conjunction with FIG. 3*b*, to selectively expose portions of the surface of the substrate 33. A second layer of dielectric 52 is deposited over the structure of FIG. 4*a*, as shown in FIG. 4*b*, to completely cover both the exposed surface of the substrate 33 and the remaining portions of the dielectric layer 31. The thickness of the layer 52 is sufficiently thin so as to allow diffusion of the desired P-type dopant therethrough, while the combined thickness of the layers 52 and 31 is sufficient to prevent diffusion of the specified dopant therethrough. Diffusion of the P-type dopant is performed, producing the P-type region 62 formed in the N-type substrate 33. The dielectric layer 52 acts as a partial barrier to the diffusing dopant species which results in a lower concentration of the dopant at the surface of the P-type region 62 than was obtained in the similar P-type region of FIGS. 3*b* – 3*e*. This lower concentration of dopant is desirable for some applications such as light emitting diodes as discussed hereinabove, but increases the difficulty of making a good ohmic contact. The aluminum-zinc alloy is ideally suited for this situation because it carries with it its own doping to make up for the lower doping concentrations. In FIG. 4*c* it is shown that after diffusion, the dielectric layer 52 is patterned to form a preohmic opening in substantially the same manner as the aforementioned preohmic openings are formed. The aluminum-zinc alloy is then deposited over the structure and into the preohmic hole 46 in the form of the layer 35. The structure is then heated to form the P+ region 32. The aluminum-zinc layer 35 is subsequently preferentially removed, leaving the region 50 in and above the preohmic hole 46 as seen in FIG. 4*d*.

METHOD IV

Figure 5A:
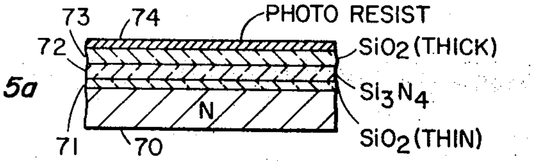
FIGS. 5*a* – 5*g* show the preferred method for providing an improved contact for a light emitting diode, utilizing an improved masking technique in which the diode junction is formed by diffusing a dopant through an oxide layer.
Figure 5B:
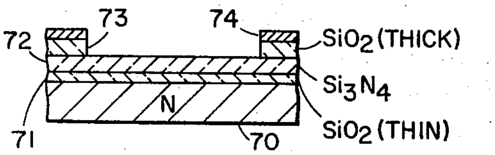
Figure 5C:
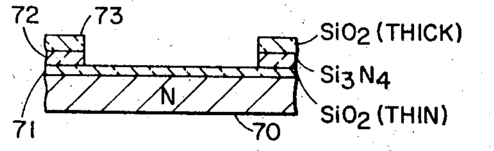
Figure 5D:
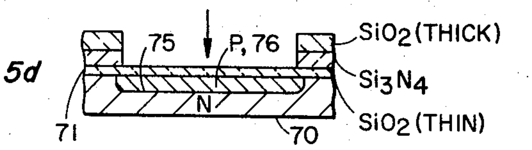
Figure 5E:
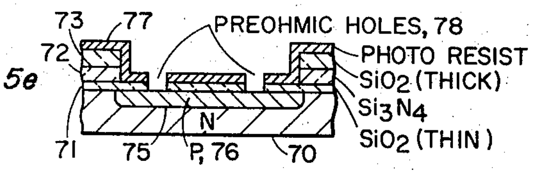
Figure 5F:
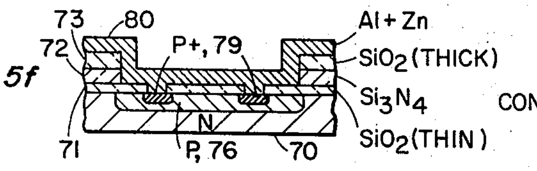
Figure 5G:
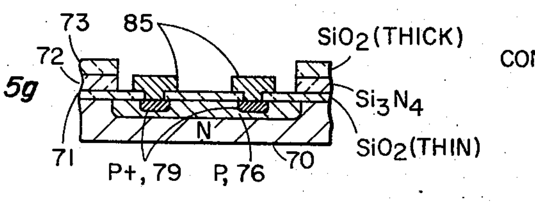

The structures shown in FIGS. 5*a* – 5*g* are the result of using the aluminum-zinc alloy to make ohmic contact to the structures described in application, Ser. No. 35,150, filed on May 6, 1970, by inventors Ronald R. Burgess, Michael G. Coleman and Robert G. Hays and now abandoned. It will be appreciated that the metallization referred to in FIGS. 5*f* and 5*g* is not mentioned in the aforementioned application. It was found that masking steps utilized in the aforementioned application were applicable in the metallization of a semiconductor substrate with the subject aluminum-zinc alloy. A brief description of the masking process found in the application filed by Burgess, Coleman and Hays follows.

It should be mentioned that the purpose of using the Burgess, Coleman, Hays technique with the subject aluminum-zinc contact is to provide for sufficient pattern definition so that the subject method may be utilized with the aforementioned light emitting diode configurations and indeed, in fact, in any configuration which requires fine definition, sharp etched edges and high quality ohmic contacts. It will be appreciated that the aforementioned application does not deal with the subject of ohmic contacts but rather with the subject of diffusion of doping materials through a dielectric thin layer. It will be noted, however, that the aforementioned applicants utilize zinc as the preferred P-type dopant for gallium arsenide and other III-V compound semiconductors.

Referring to FIG. 5*a*, a substrate 70 is provided in one embodiment, with a bottom thin layer 71 of silicon dioxide, a middle layer 72 of silicon nitride, and a top thick layer 73 of silicon dioxide. The middle layer 72 is attacked by an etchant which does not substantially attack the layer 71 or the layer 73. The top layer 73 which is deposited on the middle layer of material 72 is attacked by an etchant that does not attack or attacks at a significantly lower rate the middle layer 72. The top two layers are so thick that a desired dopant for the semiconductor will not diffuse therethrough but the bottom layer is so thin that the required amount of dopant will diffuse therethrough although the diffusion is limited somewhat by the bottom layer. The top layer 73 is masked by known photolithographic techniques, leaving a patterned photoresist layer 74 on the surface of the top layer.

As shown in FIG. 5*b*, an etchant that will not materially attack the photoresist 74 or the middle layer 72, is applied to the exposed surface of the top layer. When the exposed surface of the top layer is etched away, as shown in FIG. 5*b*, an etchant that will not substantially attack the top and bottom layers but will attack the middle layer and the photoresist is applied to the exposed surfaces of the middle layer 72 and the photoresist 74. This etchant removes the photoresist layer 74 or the layer 74 is removed in a separate step by conventional means. As shown in FIG. 5*c*, when the middle layer 72 is etched away, the structure shown in 5*c*, results in an exposed bottom layer 71. The top layer therefore serves as a mask for the etching of the middle layer. When the middle layer 72 is etched away, a dopant is diffused through the bottom layer 71, as shown in FIG. 5*d*, into the substrate 70 which is the same type of substrate as used in the previous examples. This doped region is shown as the P region 76 which forms the diode by providing a PN junction along the line 75. If desired, the top or third layer may be omitted (or if applied, removed for any reason) if the thicknesses of the combined first and second layers are great enough to prevent diffusion therethrough of the desired dopant. This omission of the top layer may be desirable if the second layer is amenable to patterning by known photolithographic techniques. Since the interface between the bottom layer and the substrate is not exposed to an etchant, the surface of the substrate, as exposed to the bottom layer, is a replica of the original pattern formed in the photoresist, whereby the pattern of the diffusion into the substrate is a replica of the original pattern formed during the photolithographic process. Since the first or bottom layer slows the diffusion, the curve of density of diffusion with distance into the substrate is flatter than when no bottom layer exists during the diffusion. In addition, any surface damage which may be caused by exposing the substrate directly to the dopant source, such as evaporation or decomposition of the substrate surface or deleterious chemical reaction of the substrate with the dopant, is significantly reduced by the presence of the first layer, that is, layer 71.

As shown in FIG. 5*e*, a second photoresist layer 77 is applied and patterned so as to leave apertures 78 therethrough. The first layer 71 is then provided with preohmic holes at the apertures 78 by etching through layer 71 so as to permit the deposition of an aluminum-zinc alloy layer 80 therethrough to the P region 76. This deposition is shown in FIG. 5*f* to cover all exposed portions of the top surface of the structure. This deposition creates self-doped P+ regions 79 under the apertures 78 as in methods I-III. Thereafter, the layer 80 is patterned and etched so as to form the contacts 85 as shown in FIG. 5*g*. As before, the aluminum-zinc alloy deposition will be described in connection with FIG. 9. In the method shown in FIGS. 5*a* – *g*, layer 71 may be silicon dioxide in a thickness of between 300 and 1,000 angstroms. The dopant may be zinc, a P-type dopant, since zinc will diffuse through such a thickness of $SiO_2$. The aforementioned silicon nitride layer, layer 72, is on the order of 500 to 2,000 angstroms thick while the layer 73 is on the order of about 1,000 to 2,000 angstroms thick. The combined thickness of the aforementioned layers is enough to prevent the diffusion of zinc therethrough. The etchant used to etch through layer 73 is hydrofluoric acid since it will not attack at any significantly high rate the silicon nitride layer. A phosphoric acid based etchant is applied to layer 72 which does not materially affect either the first layer 71 or the top layer 73.

Figure 6:
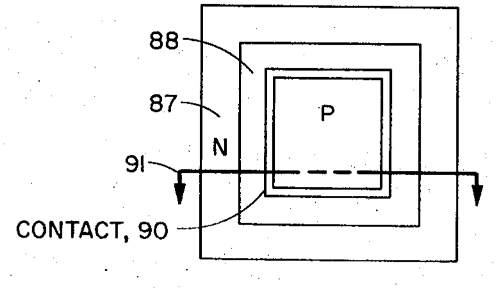
FIG. 6 is a top view of a light emitting diode formed by the method shown in FIGS. 5*a* – 5*g*.
Figure 7:
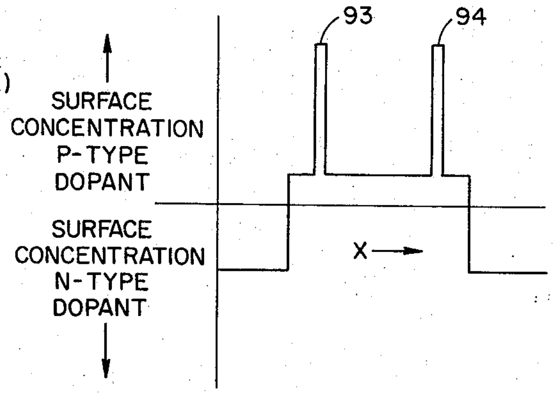
FIG. 7 is a graph showing the concentration of the dopants across the surface of the diode shown in FIG. 6.

Referring now to FIG. 6, a top view of the light emitting diode is shown with an N-region 87 and a centrally located P-region 88 on which is deposited a contact 90 by the method shown in FIGS. 5*a* – 5*g*. As mentioned hereinbefore, it is important in light emitting diodes that the contact 90 occupy a very small amount of the total area of the P-region 88, since the contact effectively blocks the light emanating therefrom. The surface concentration of the P and N type dopants across the face of the light emitting diode, along the arrows 91, is shown in FIG. 7 to have a moderately heavy concentration in the N-material and only light concentration across the bulk of the P-material, while having high concentration only immediately under the contact 90 due to the self-doping of the contact. This is shown by raised portions 93 and 94 of the graph.

Figure 8:
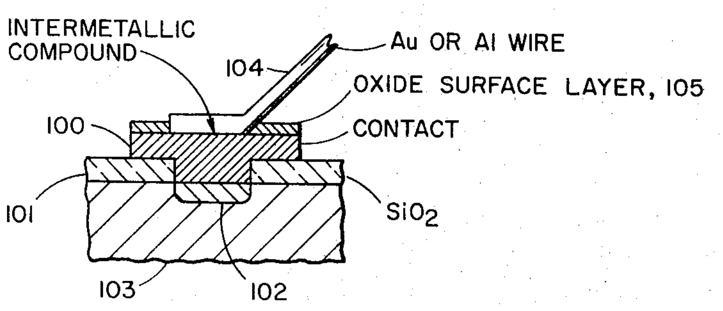
FIG. 8 is a diagram of a contact prepared according to the teachings of this invention showing the position of the intermetallic compound formed between gold wire bonded to a contact and also showing the oxide surface layer associated with the contact.

Referring now to FIG. 8 a typical contact 100 is shown projecting through a portion of an isolation layer 101 and contacting a highly doped portion 102 of a substrate 103. Attached to this contact is an aluminum or gold wire 104. As mentioned previously, the prior art elemental aluminum contacts have an oxide layer 105 which in some cases can be thick enough to prevent the bonding of the wire 104 to the contact 100. This oxide layer in addition to being thick is also continuous or coherent. Thus the layer must be broken in order to weld to the contact 100. If the oxide surface layer 105 is sufficiently thick, increased pressures are required to make an adequate bond between the wire 104 and the contact 100. In addition, in the case where gold wire is used in bonding to the contact 100, an intermetallic compound is often formed at the interface between the wire 104 and the contact 100. When elemental aluminum is used this intermetallic compound it is excessively brittle causing the bond between the wire and the contact to be broken.

The subject contact, being an aluminum-zinc alloy, has a characteristically thinner and less coherent or continuous oxide surface layer 105 than is associated with elemental aluminum contacts. The thinness and discontinuity of the oxide surface layer permit ready bonding of the wire to the contact. This results in maximum bonding strengths with a minimum of bonding pressure. This property results from the less coherent oxide which is formed on the surface of the contact 100 in addition to its being thinner. In tests performed on the aluminum-zinc contact, the metallization layer was cycled through 15 minute cycles in a pure oxygen ambient at 460°C to see if a tough coherent oxide layer could be produced. It could not be produced since subsequent to this procedure there was in evidence no difference in the ability to bond a wire to the contact. In otherwords, the wire bonded to the contact exactly as if it had not been through the oxidation cycle.

In addition to the improved properties at the surface of the aluminum-zinc contact, the formation of a brittle intermetallic compound when gold wire is bonded to the contact is retarded or eliminated. Instead, any new intermetallic compound formed is less brittle and is thus not as detrimental as the intermetallic compound that may be formed between the pure gold and the pure aluminum contact. In either case the intermetallic compound is generally formed at high temperatures on the order to 400° C or greater and becomes more prevalent as the melting point of aluminum is reached. In order to test the reliability of bonds to the aluminum-zinc contact, the entire metallization system was cycled through a half-hour at 480° C with no apparent change in wire bond strength. The presence of the zinc therefore in the system retards the formation of brittle intermetallic compounds.

METHOD OF DEPOSITING THE ALLOY

Central to the formation of an aluminum-zinc alloy on a substrate is the method by which the alloy is deposited on the substrate. Previously, it has been extremely difficult to deposit two metals simultaneously on a substrate because of the varying evaporation rates of the two metals. This results in an alloy on the surface of the substrate which is not homogeneous in composition throughout its thickness. In addition to the nonhomogenity of the alloy, there is a certain layering effect due to the varying deposition rates. In the prior art, the particular alloy was deposited sequentially and the coated or metallized substrate then heated so as to form the alloy after the elemental metal layers had been deposited. The formation of the alloy on the substrate thus required that the substrate be heated to the temperature at which both of the elemental metals would interdiffuse to form the desired alloy. In many cases this resulted in damage to the active elements within the substrate. An alternate method in the prior art was to evaporate the two metals simultaneously from two separate sources. Without very sophisticated and expensive equipment, this alternate method has substantially the same drawbacks as the first method in that layering and non-homogeneous structures result.

The present method utilizes co-evaporation of the elemental aluminum and the elemental zinc from a single source with the substrate temperature being maintained anywhere between ambient room temperature and 400°C. The preferred substrate temperature centers around 200°C which is considerably less than that which damages the active elements in the chip. Co-evaporation is successful in the subject method because the elemental zinc and the elemental aluminum are deposited very rapidly after the alloy has been formed within the single resistive heating element of the evaporation chamber. This results in substantially constant evaporation rates of the two elements from the alloy and thus in homogeneous and uniform alloys being deposited on the relatively cool substrate. In referring to the method steps of three possible methods for the formation of the aluminum zinc alloy it will be appreciated that zinc melts in the vicinity of 400°C while the aluminum melts in the vicinity of 660°C.

Figure 9:
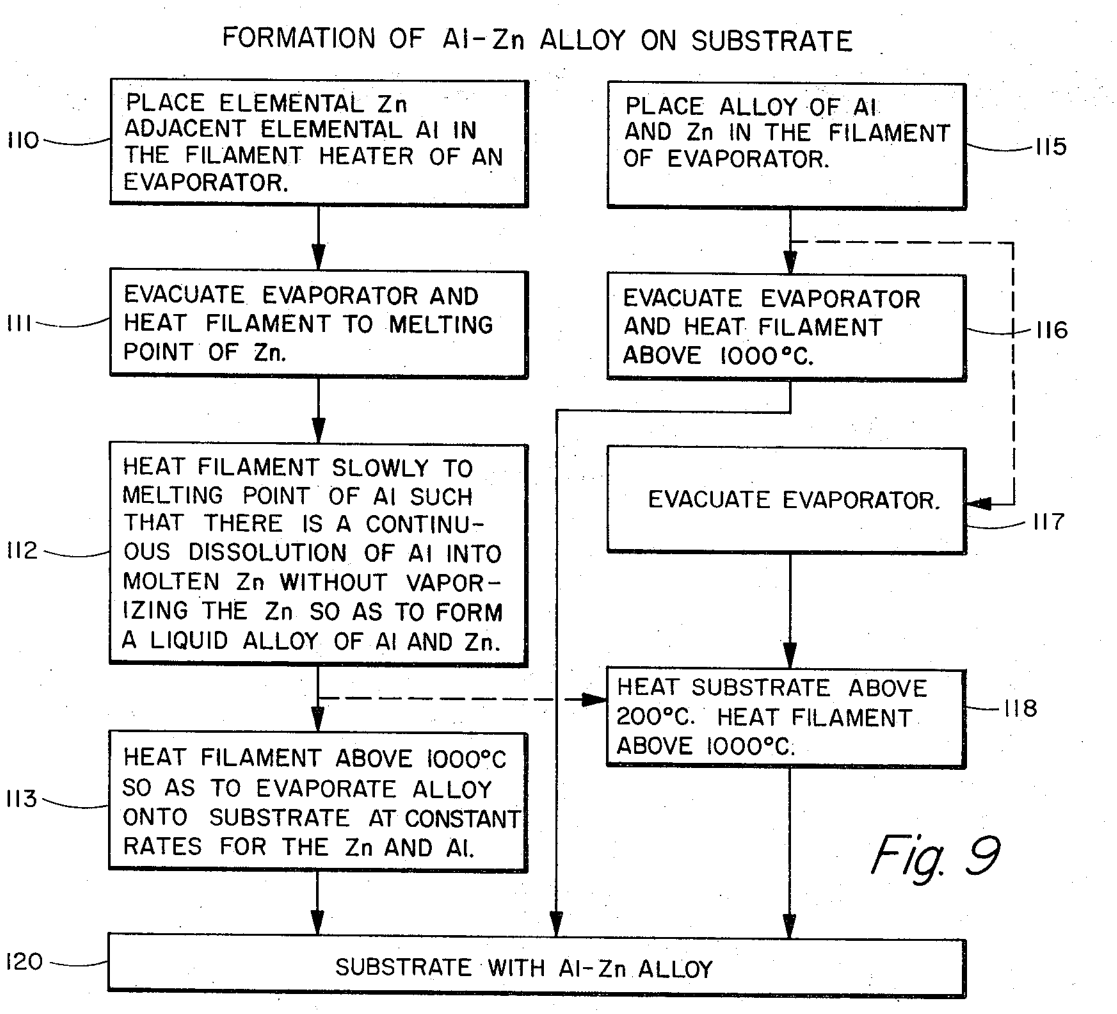
FIG. 9 is a diagram indicating the method of depositing the aluminum-zinc alloy shown in the boxes so labelled in FIGS. 2, 3, 4 and 5, and indicating three alternate methods of forming the aluminum-zinc alloy on a semiconductor substrate.
Figure 10:
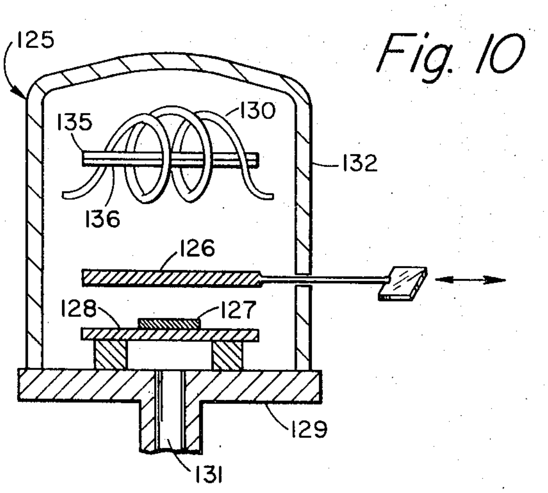
FIG. 10 is a diagrammatic representation of an evaporation chamber showing the side-by-side placement of elemental zinc and elemental aluminum in the filament heater element of the evaporator.

In the first set of steps shown sequentially in FIG. 9 and labelled 110 to 113, elemental zinc is placed adjacent elemental aluminum in the filament heater element 130 of an evaporator 125 as shown in FIG. 10. This evaporator is provided with a movable barrier 126 so that no evaporating material is deposited on the substrate 127 therebeneath until the filament temperature has reached the desired evaporation temperature at which point it is removed from the path between the filament and the substrate. The substrate is supported on a heated platform 128 which is supported on the base of the evaporator 129. The chamber of the evaporator is evacuated to less than $10^{-3}$ torr through an orifice 131. In the first method, as shown by method step 110, elemental zinc 135 is placed adjacent elemental aluminum 136 within the filament heater element 130. The evaporator 125 is then evacuated to the aforementioned vacuum and the filament is heated to the melting point of zinc as shown in the method step 111. This is accomplished by visually ascertaining that the zinc is melting by observing the zinc through the transparent wall, 132, of the evaporator 125. Visual confirmation of the melting of the zinc is important because in a vacuum the zinc has an extremely high vapor pressure. When it has been visually ascertained that the zinc is melting, the heat of the filament is increased extremely slowly so as not to vaporize off any significant portion of the zinc before the melting point of aluminum has been reached. As shown in the method step 112, this results in a dissolution of the aluminum into the molten zinc without substantial evaporation of the zinc so that a liquid alloy of the aluminum and zinc is finally formed. In this step the filament heat is increased from the vicinity of 400°C to the vicinity of 660°C in a time period between five and fifteen minutes. When a liquid alloy has been formed, the temperature of the heater element is increased very rapidly above 1,000°C and preferably as high as 1,400°C–1,500°C in order to evaporate the alloy thus formed very rapidly from the filament. This is shown in the method step 113. The rapid evaporation of the alloy permits the elemental elements within the alloy to be deposited at substantially constant rates so as to form the aforementioned homogeneous alloy at the surface of the substrate. The rapid evaporation ensures that any fluctuations in rate take place over a very short period of time and therefore have a negligible effect on the composition of the deposited alloy. The substantially constant evaporation rates of the aforementioned alloy are important because the alloy formed is a two-phase alloy with one phase being aluminum-rich, the second phase being zinc-rich, and the two phases being intermingled. The composition range of the alloy, between 1 and 60 wt % zinc, has been chosen such that the phase present in the largest volume is the aluminum-rich phase. This provides that the system behave very similar to that of pure aluminum in photoresist processing and wire bonding.

An alternate method for performing the metallization of the substrate is shown by the method steps 115 and 116 with the result being the same as that for the aforementioned method steps as indicated by the result labelled 120. In this case, the alloy of aluminum and zinc is made prior to its being placed in the heater element of the evaporator 125. This is shown by the method step 115. The evaporator 125 is then evacuated and the filament quickly heated above 1,000°C so as to quickly evaporate the alloy onto the substrate. This is shown by the method step 116.

In both of the methods 110 through 113 and 115 through 116 nothing was said about the substrate temperature. As mentioned hereinbefore, substrate temperature may vary between ambient room temperature and 400°C. An alternate method of fabrication is shown by the method steps 117 and 118 in which the evaporator 125 is evacuated and the substrate heated in the vicinity of 200°C or above followed by the heating of the filament to 1,000°C or above so as to evaporate the alloy. As shown in FIG. 9, the heated substrate can be utilized in either one of the two aforementioned methods of metallization. In either of the three methods shown in FIG. 9 a metallized substrate is provided as shown at 120 with an aluminum-zinc alloy which has the aforementioned qualities and which is in the proportions mentioned in connection with the method shown in FIG. 2.

In summary, the formation of an aluminum-zinc contact according to the methods described herein results in a self-doping contact which is homogeneous so as to facilitate etching, which is readily wire bondable, which has an aluminum-like compatibility, and which requires lower bonding heats and shorter recycling times than those necessary for pure aluminum contacts. In addition, when gold wire is used, a new gold-aluminum-zinc intermetallic compound is formed at the surface of the contact which is less brittle. The homogeneity of the alloy is provided by co-evaporation in which the evaporation rates of the elemental zinc and the elemental aluminum are constant. There is provided improved masking such that improved pattern definition is achieved with the aforementioned homogeneous alloy. In addition, electro-migration is reduced due to the density of the zinc and the finer grain structures which are evidenced at lower substrate evaporation temperatures and which are inherent in the two phase alloy. Thus, the subject contact may be utilized with semiconductor material of all kinds. As mentioned hereinbefore, doping of the substrate with the zinc is done in a manner such that a high concentration of the dopant occurs at the surface of the substrate so as to form a shallow doping area or region. This is advantageous when utilized with light emitting diodes. Finally, there is a thinner and less coherent oxide formed on the surface of the aluminum zinc contact as compared with the pure aluminum contact which results in the aforementioned lower bonding pressures necessary for wire or die bonding.

What is claimed is:

1. A method for making an ohmic contact to a region of semiconductor comprising the steps of:

forming an insulating layer on a surface of a first region of semiconductor, said first region of semiconductor being of a first conductivity type;

forming an opening in said insulating layer, exposing said surface;

forming a metal layer on said insulating layer and on said exposed surface, said metal layer including a first metal and a second metal, such that impurity ions of said second metal are of said first conductivity type and the entectic between the semiconductor and the first metal being higher than the entectic between the semiconductor and the second metal, diffusing ions of said second metal through said exposed surface into said first region of semiconductor, by heating to a temperature below the entectic between the semiconductor and the first metal, thus forming a relatively heavily doped second region of said first conductivity type within said first region at said surface and wherein said second metal does not form an alloy with said semiconductor.

2. The method as recited in claim 1 wherein said metal layer is a metal alloy of said first metal and said second metal.

3. The method as recited in claim 1 wherein said relatively heavily doped second region is sufficiently heavily doped to be degenerate.

4. The method as recited in claim 1 wherein said first region of semiconductor is a type III-V semiconductor compound.

5. The method as recited in claim 4 wherein said first region of semiconductor is gallium arsenide.

6. The method as recited in claim 2 wherein said second metal is zinc.

7. The method as recited in claim 5 wherein said first metal is aluminum.

* * * * *